United States Patent [19]

Rubens et al.

[11] 4,155,047

[45] May 15, 1979

[54] VOLTAGE CONTROLLED ATTENUATOR

[76] Inventors: Harvey A. Rubens, 1207 N. Orange Grove; David L. Baskind, 1201 N. Orange Grove Ave., both of Los Angeles, Calif. 90046

[21] Appl. No.: 868,486

[22] Filed: Jan. 11, 1978

[51] Int. Cl.² .............................................. H03G 3/30
[52] U.S. Cl. ..................................... 330/284; 330/254
[58] Field of Search ............... 330/145, 254, 278, 282, 330/284; 307/264; 358/27

[56] References Cited

U.S. PATENT DOCUMENTS

| | | | |
|---|---|---|---|
| 3,641,450 | 2/1972 | Lunn | 330/254 |
| 3,757,240 | 9/1973 | Fogg | 307/264 X |
| 3,999,141 | 12/1976 | Cochran et al. | 330/254 |
| 4,045,748 | 8/1977 | Filliman | 330/254 X |
| 4,065,725 | 12/1977 | Lillis et al. | 330/254 |

*Primary Examiner*—James B. Mullins
*Attorney, Agent, or Firm*—Singer & Singer

[57] ABSTRACT

A voltage controlled attenuator having extremely wide dynamic range and having low distortion is achieved by limiting the current density in each unit area of the transistors to minimize the current noise and by utilizing high current sources to minimize the noise voltage. A pair of compound gain cells having low current densities are each directly fed by a linearized current source. The gain cells are controlled by a single gain control voltage and feed a pair of linearized buffer amplifiers for minimizing loading on the gain cells. The output of the buffer amplifiers feed a differential output amplifier for generating an output signal that eliminates the effect of the control voltage in the output signal and any DC shift caused by changes in control voltage and nulls remaining distortion products.

11 Claims, 4 Drawing Figures

VOLTAGE CONTROLLED ATTENUATOR

This invention relates to a voltage controlled attenuator and more specifically to a voltage controlled attenuator having wide dynamic range and low distortion.

The basic gain cell principle concerns the use and modification of differential amplifiers and has been the subject of articles and experimentation.

For example, the Quatre Company of Canoga Park, California 91304, has recently published an article entitled "Quatre Gain Cells Solid State Electronic Products." The Quatre article describes and illustrates the gain cell approach the bipolar transistor audio products. The term "gain cell" is believed first used by B. Gilbert in the referred-to article and has been described as a log/antilog transconductance multiplier.

The present invention is concerned primarily with utilizing the basic concepts of the gain cell as an essential element in a voltage controlled attenuator having an extremely wide dynamic range and lower distortion components that have heretofore been achieved by the prior art.

A voltage controlled attenuator is bascially a gain control device used to control the gain of an external circuit which may be a receiver, a switching device, or any other remotely controlled electronic circuitry.

It is usually most desirable to use a low level control voltage and preferably a DC voltage to control the gain of some external electronic device and usually this control takes place at a remote location. By utilizing a DC control voltage the operator can be located at a remote location without fear of affecting the circuit being controlled.

In the typical case input signals to be controlled are differentially fed to a pair of gain cells also controlled by a DC voltage control for varying the gain of the input signal. The output signals from the gain cells are fed to a differential amplifier which has the well known effect of cancelling out the DC effect caused by the control voltage used on the gain cells and allowing only the attenuated AC signal to appear in the output of the differential amplifier. Unfortunately these devices lacked speed and dynamic range and suffered from distortion.

Prior art patents describing the basic theory and operation of gain cells and differential amplifiers are described for example in U.S. Pat. No. 3,727,146 issued Apr. 10, 1973 to Richard Smith Hughes entitled "Linear Voltage Variable Temperature Stable Gain Control" and U.S. Pat. No. 3,875,522 issued Apr. 1, 1975 to Werner H. Hoefi entitled "Integrated Direct-Coupled Attenuator." A more recently issued U.S. Pat. No. 3,921,091 issued Nov. 18, 1975 to inventors Kessel and School entitled "Amplifier Circuit" also describes the basic gain cell and circuit attempts to utilize the gain cell as a voltage controlled attenuator.

Unfortunately these prior art patents simply recognize the advantages of utilizing the basic concept of the differential amplifier and the cancellation feature of the DC control voltage in the output of the differential amplifier. The basic problem of high distortion and limited dynamic range and limited speed still exists in the prior art circuits because the basic limiting considerations have not been fully understood and implemented until now.

The present invention recognizes the inherent limitations of the present day gain cell and provides the implementation and circuit to now achieve a voltage controlled attenuator having high speed and wide dynamic range and without the disadvantage of distortion caused by loading effects on the gain cell.

In this invention there is described a voltage controlled attenuator comprising a pair of gain cells having low current densities and in which each cell is directly fed by a linearized current source adapted to receive appropriate input signals. In the preferred embodiment, the low current densitis are achieved by using large area transistors for maintaining the low current densities, however, it is also contemplated that parallel multiple transistors may also be used to provide the increased areas needed to minimize the current density problem.

The gain cells are controlled by a single control voltage that feeds both control cells simultaneously.

A linearized buffer amplifier is connected to the output of each gain cell for minimizing loading on the gain cell thereby minimizing distortion.

A differential output amplifier is fed by the buffer amplifiers for generating an output signal in which the effect of the control voltage in the output signal is eliminated and any DC shift caused by changes in control voltage and residual distortion is removed by the operation of the differential output amplifier.

The circuit is implemented by utilizing a pair of transistors in each gain cell in which each pair of transistors have emitters connected together and each pair of emitters is fed directly by a separate linearized current source adapted to receive reciprocal input signals.

One transistor of each pair in the gain cell has the base and collector connected together and to signal ground. The bases of the other transistor of each pair are then connected together and fed by a single control voltage.

The gain cell circuit may therefore be likened to a pair of differential amplifiers with the control voltage driving one base of each pair of transistors comprising the gain cells.

A separage resistor is connected from each of the collectors of the other transistors comprising the gain cells to a voltage source thereby developing the output voltage from the gain cells across these load resistors.

A buffered differential amplifier is connected across the load resistors for generating the output signal.

In the preferred embodiment, separate buffer amplifiers are used, each with its own linearized current source, the minimize the effect of saturation when high attenuation is required from the circuit.

Further objects and advantages of the present invention will be made more apparent by referring now to the accompanying drawings wherein.

Figure 1:
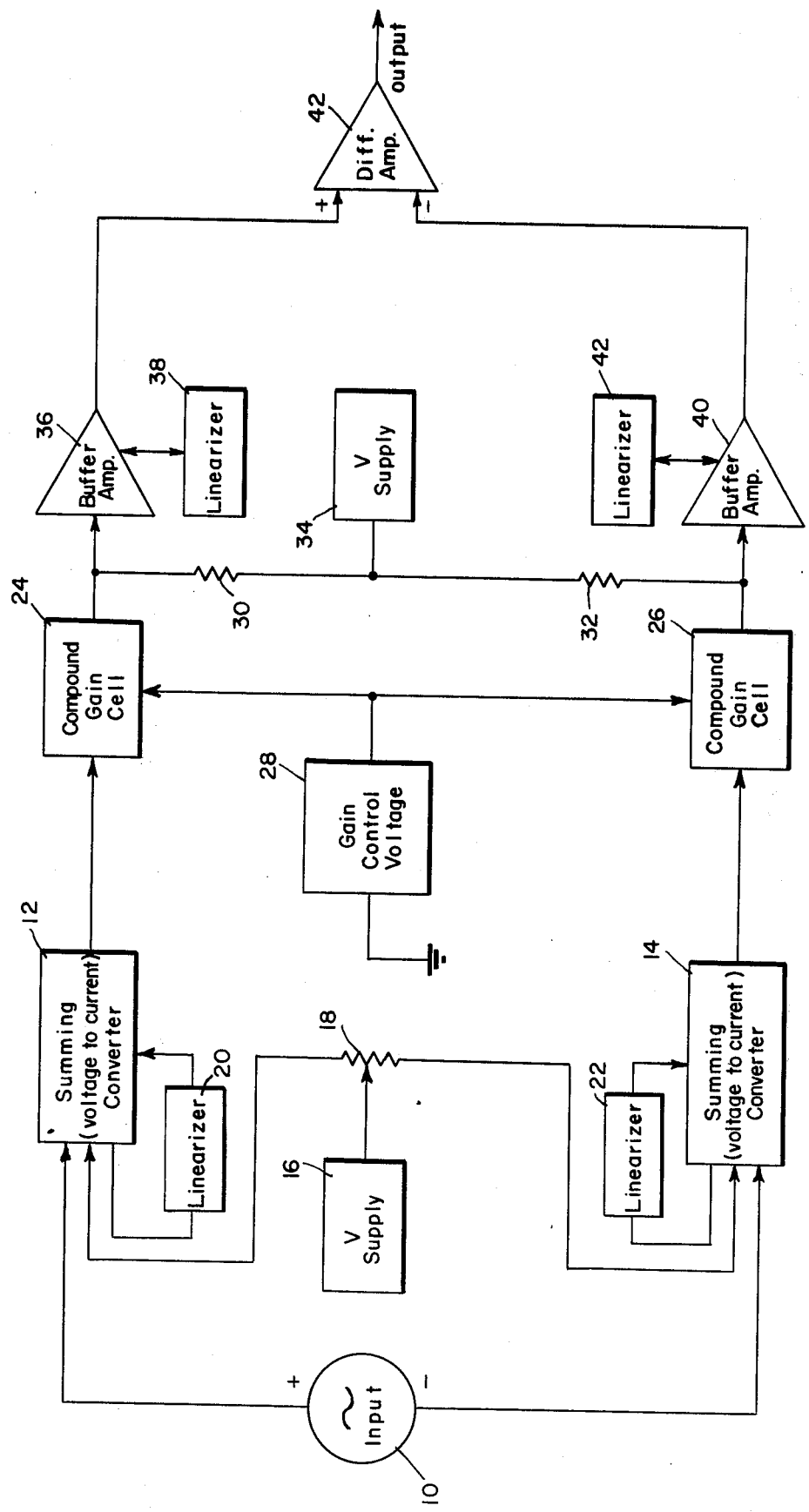
FIG. 1 is a block diagram of the voltage controlled attenuator constructed according to the present invention.

Referring now to FIG. 1, there is illustrated a block diagram of a voltage controlled attenuator that is essentially a unity gain device. While it is recognized that the circuit may also be used as a voltage controlled amplifier, it is thought best to describe the circuit as an attenuator since the attenuator may then be considered the basic building block which may be placed in feedback circuit with an amplifier to control the gain of an amplifier and produce what is also known as a voltage controlled amplifier.

The input signal is usually an AC varying signal 10 that is varying about ground symmetrically and which feeds equal and out of phase components to identical summing voltage to current converters 12 and 14, respectively.

The purpose of the circuit being described is to attenuate the input signal to any desired level from no attenuation to infinite attenuation without introducing any distortion products in the output signal. Since the circuit has unity gain, it is described as an attenuator rather than as an amplifier. As mentioned previously the attenuator may be used in a feedback circuit with an amplifier, thereby making the complete system a voltage controlled amplifier and allowing the designer to achieve gain if that is his desire.

The essence of a voltage controlled attenuator is to use a control voltage which may be a DC voltage to control attenuation of an input signal without distorting or changing any of the original qualities of the input signal other than gain. Since the device may be used as a modulator, the control voltage may be a varying signal.

A control signal may be located at a remote location thereby keeping signal paths as short as possible and eliminating the need to send signal lines to remote control panels for attenuation or control. Multiple devices may also be controlled from a single control source.

The input signal from signal source 10 is first mixed with a DC quiescent signal from a referenced voltage source 16. A referenced voltage from source 16 supplies a DC quiescent signal through trimmer potentiometer 18 to both converters 12 and 14 thereby summing the non-inverted input signal with the DC quiescent signal in converter 12 and converting the inverted input signal with the DC quiescent signal in converter 14.

Trimmer 18 is used to minimize DC shift with attenuation by balancing the DC characteristics of the complete system.

The summing converters 12 and 14 are identical and perform the same function except that summing converter 12 sums the non-inverted input voltage with the DC quiescent voltage, whereas summing converter 14 sums the inverted input voltage with the DC quiescent voltage.

The output of summing converters 12 and 14 is a current signal that may be expressed as follows where:
 $V_{IN}$ is input signal voltage
 $V_Q$ is input quiescent voltage
 $I_1$ is output current from converter 12
 $I_1'$ is output current from converter 14.
The current output from summing converter 12 is:

$$I_1 = K_1(V_Q + V_{IN})$$

The current output from summing converter 14 is:

$$I_1' = K_1(V_Q - V_{IN})$$

The output currents $I_1$ and $I_1'$ represent current values that are proportional to the input voltages.

The output currents from summing converter 12 and summing converter 14 are each fed to a compound gain cell 24 and 26, respectively. The term "compound" used in a definition of gain cells 24 and 26 is intended to define active elements within the gain cells having low current densities. In the art as practiced today this could include transistors having large geometries such as high speed power transistors or the use of multiple parallel transistors, both of which are now presently available in chip form. The multiple parallel transistors place a plurality of bases in parallel and a plurality of emitters in parallel and a plurality of collectors in parallel, thereby effectively achieving a large geometry resulting in a low current density within the active element.

Compounding the active elements has the effect of reducing the noise floor of the element thereby increasing the dynamic range of the gain cell and allowing the use of low impedances which minimize thermal noise.

Each of the gain cells 24 and 26 is a modified differential amplifier connected to a single gain control voltage 28 that is used to simultaneously vary the output of the cells to result in an attenuation in the output signal.

The output from gain cells 24 and 26 is a varying current through load resistors 30 and 32, respectively, that are joined together and fed by a voltage supply 34.

The output voltage developed across load resistor 30 is fed to a buffer amplifier 36 that is controlled by a linearizer circuit 38.

In a similar manner the output voltage from gain cell 26 developed across load resistor 32 is fed to a buffer amplifier 40 that is controlled by a linearizer circuit 42. The output voltage across load resistor 30 is an AC signal referenced to supply 34, which signal is equal to, and out of phase with, the output voltage developed across load resistor 32.

During conditions of high attenuation the quiescent output voltages from gain cells 24 and 26 will approach the supply voltage 34. The linearized buffer amplifiers 36 and 40 are loaded by an idealized current sink which minimizes loading on the output of the gain cells 24 and 26 thereby allowing the output voltage to approach the buffer supply voltage 34 without distortion that would otherwise be present.

The output of the gain cell 24 is calculated as follows:

$$E_{gain\ cell\ 24} = \frac{I_1 \cdot R_{30}}{1 + e^{K_2 \cdot V_c}}$$

$$= \frac{K_1(V_{IN} + V_Q)}{1 + e^{K_2 \cdot V_c}} \cdot R_{30}$$

In a similar fashion the output of gain cell 26 is calculated as follows:

$$E_{gain\ cell\ 26} = \frac{I_1' \cdot R_{32}}{1 + e^{K_2 \cdot V_c}}$$

$$= \frac{K_1(V_Q - V_{IN})}{1 + e^{K_2 \cdot V_c}} \cdot R_{32}$$

$R_{30} = R_{32} 32\ R_L$
$K_1$ = voltage current conversion factor of gain cells
$K_2$ = attenuation constant for gain cell The output of buffer amplifier 36 and buffer amplifier 40 is fed to the non-inverting and inverting terminals, respectively, of a differential amplifier 42 which algebraically combines the inputs and generates an output signal that eliminates the effect of the DC gain control voltage 28, the DC guiescent voltage supplied by reference 16, and residual distortion products.

The output of the differential amplifier 42 may be calculated as follows:

Differential output = voltage gain cell 24 − voltage gain cell 26

$$= \frac{K_1(V_{IN} + V_Q)}{1 + e^{K_2 \cdot V_c}} \cdot R_L - \frac{K_1(V_Q - V_{IN})}{1 + e^{K_2 \cdot V_c}} \cdot R_L$$

$$= \frac{2 K_1 \cdot R_L \cdot V_{IN}}{1 + e^{K_2 \cdot V_c}}$$

Figure 2:
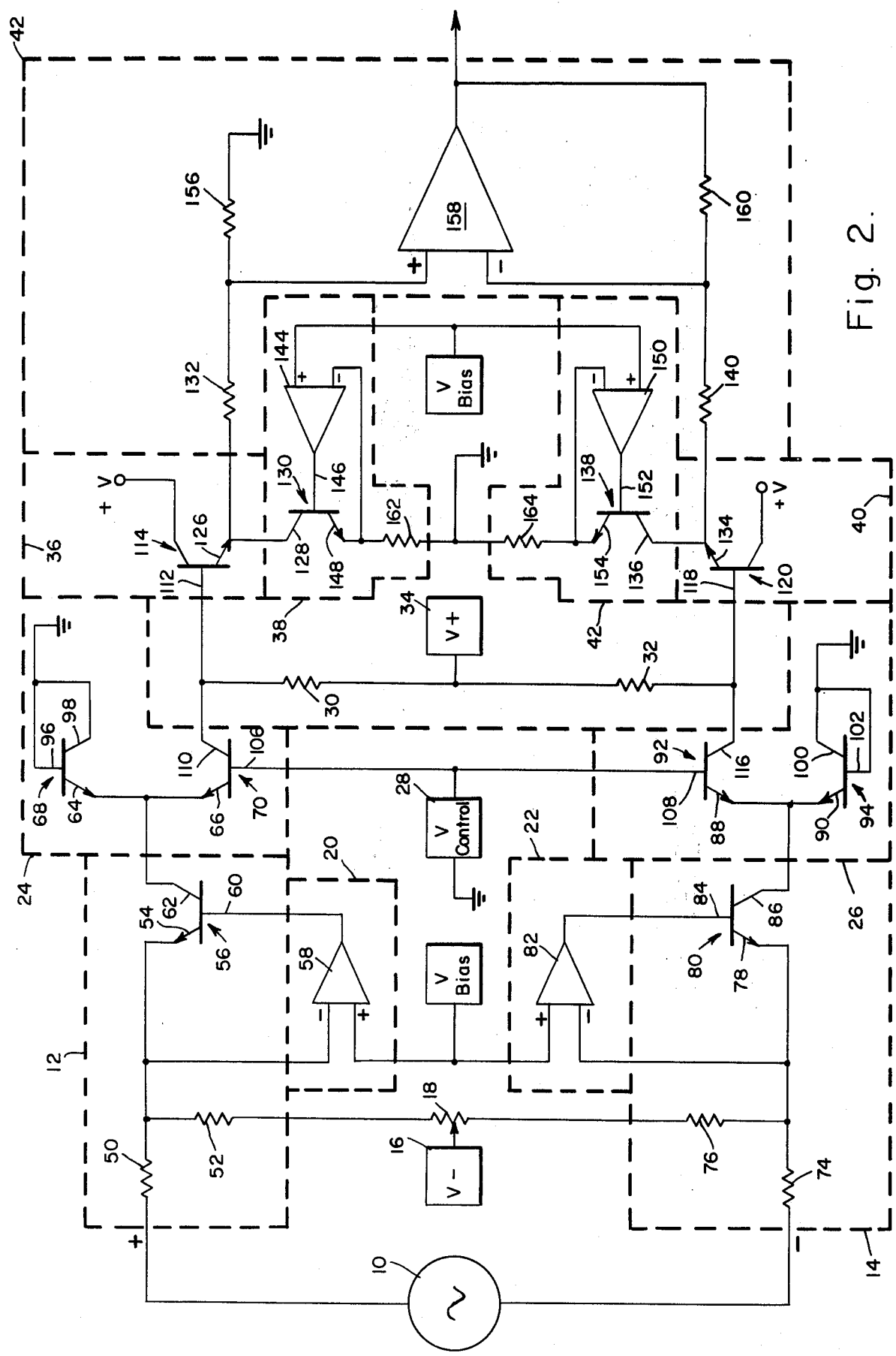
FIG. 2 is a schematic diagram of a preferred embodiment of the voltage controlled attenuator.

Referring now to FIG. 2, there is shown a schematic diagram more fully illustrating an embodiment of the circuits shown in block form in FIG. 1.

The non-inverted signal from input signal source 10 is fed to the input of summing converter 12 where the input signal is developed across a resistor 50. A DC quiescent voltage from supply voltage 16 is developed across resistor 52, the output of which joins resistor 50 and is connected to the emitter 54 of transistor 56.

The actual summing of the signal from source 10 and the DC signal from supply 16 takes place at the emitter 54.

The linearizing circuit 20 consists of amplifier 58 which inverts the signal at the emitter 54 of transistor 56 and feeds the signal back to the base 60. In this fashion feedback is obtained, thereby linearizing the characteristic of the base emitter junction of transistor 56. The conversion from voltage to current is thereby idealized.

The output current from collector 62 of transistor 56 is fed to the input of gain cell 24 which consists of the junction of emitters 64 and 66 of transistors 68 and 70, respectively.

In a similar fashion the inverted voltage signal from signal source 10 is fed to the input of summing converter 14 which comprises a resistor 74 connected to the junction of resistor 76 fed by reference voltage 16 and emitter 78 of transistor 80. The linearizing circuit 22 comprises an amplifier 82 that feeds the signal from emitter 78 back to base 84 of transistor 80, thereby obtaining an idealized conversion from voltage to current.

The output current of transistor 80 is taken from collector 86 which feeds the input to the gain cell 26 at the junction of 88 and 90 of transistors 92 and 94, respectively.

Transistors 56 and 80 in the summing converters 12 and 14, respectively, are connected in circuit as common base amplifiers thereby providing fast operation with minimal speed limitation and minimal slew rate limitation. The converters 12 and 14 can operate as fast as the feedback amplifiers 58 and 82.

In gain cell 24 the base 96 and collector 98 of transistor 68 are connected together and grounded. In a similar fashion in gain cell 26 the collector 100 and the base 102 are connected together and grounded.

The base 106 of transistor 70 is connected jointly with the base 108 of transistor 92 and the junction connected to the gain control voltage 28 which is referenced to ground.

The output of gain cell 24 is taken from collector 110 and fed to the junction of load resistor 30 and base 112 of the transistor 114.

In a similar fashion the output of gain cell 26 is taken from collector 116 of transistor 92 and fed to the junction of load resistor 32 and the base 118 of transistor 120.

A review of gain cell 24 will show that transistors 68 and 70 are connected together in the basic configuration of a differential amplifier. The total emitter current through transistors 68 and 70 will therefore be constant and changing the gain control voltage 28 which is common to the base leads 106 and 108 of transistors 70 and 92 will therefore have the effect of changing the impedance between emitter 66 and collector 110 of transistor 70 and the impedance between emitter 88 and collector 116 of transistor 92.

Changing the impedance of transistor 70 changes the current flowing through the collector 110 through the load resistor 30 and thereby changing the output voltage. Since the total current flowing through both transistors 68 and 70 forming the gain cell 24 is a constant, the additional current must then pass through transistor 68.

In a similar fashion gain cell 26 is also controlled by the gain control voltage 28 which in the event of increased attenuation voltage increases the impedance of transistor 92 resulting in less current passing through the collector 116 and hence less current flowing through load resistor 32 resulting in a smaller output voltage. The differential action of transistors 92 and 94 will cause additional current to flow through transistor 94 since the total emitter current of transistors 92 and 94 connected as a differential amplifier must be constant.

High current values flowing through the transistors of the gain cells create a high current noise problem that is minimized by limiting the current density of all transistors comprising the gain cells.

In the preferred embodiment this is accomplished by means of large area transistors such as power transistors or by utilizing multiple parallel transistors to achieve the larger areas required. By lowering current densities while maintaining high overall circuit current, it is possible to obtain low noise currents and still maintain low noise voltages by means of lower circuit impedances.

The output of the above amplifier 36 is taken from emitter 126 of transistor 114 and fed to the junction of collector 128 of transistor 130 located in the linearizing circuit 38 and resistor 132 feeding the non-inverting input of the differential amplifier 42.

In a similar fashion the output of buffer amplifier 40 is taken from emitter 134 which feeds the junction of collector 136 of transistor 138 located in the linearizing circuit 42 and resistor 140 located in the inverting input to the differential amplifier 42.

The buffer amplifier 36 consists of transistor 114 and a linearizing circuit consisting of transistor 130, inverting amplifier 144 which feeds a signal to the base 146 from the emitter 148, and resistor 162.

The impedance of transistors 70 and 92 are in series with load resistors 30 and 32, respectively, to supply voltage 34 thereby causing collectors 110 and 116 of transistors 70 and 92 to operate closer to the supply voltage at higher attenuations.

The constant current sink prevents saturation of transistor 114 in the presence of a large output signal and/or high attenuation. By keeping the current constant, saturation of transistor 114 is prevented and distortion products caused by such saturation are minimized. Stated another way, the constant current to sink 38 extends the linear operating range of transistor 114.

In a similar fashion the output at emitter 134 of buffer amplifier 40 is loaded by a constant current sink comprised of inverting amplifier 150, transistor 138, and resistor 164.

The output of the buffer amplifier 36 is taken from emitter 126 and fed through resistor 132 to the junction of resistor 156 and the non-inverting input of differential amplifier 158.

In a similar fashion the output of buffer amplifier 40 is taken from emitter 135 through resistor 140 to the junction of resistor 160 and the inverting input to the differential amplifier 158.

In the preferred embodiment resistors 132 and 140 are equal, and resistors 156 and 160 are equal. The resistor 156 in the differential amplifier is required in order to ensure that the gain of the inverting side of the differential amplifier will be equal to the gain of the non-inverting side.

In an effort to maintain as low a noise voltage as possible it is suggested that the impedance value of any of the load resistors be kept as low as practical. Thermal noise voltage in a resistor is proportional to the square root of the actual resistance. Increasing the resistance by a factor of two has the effect of increasing the noise voltage by 3 db.

Figure 3:
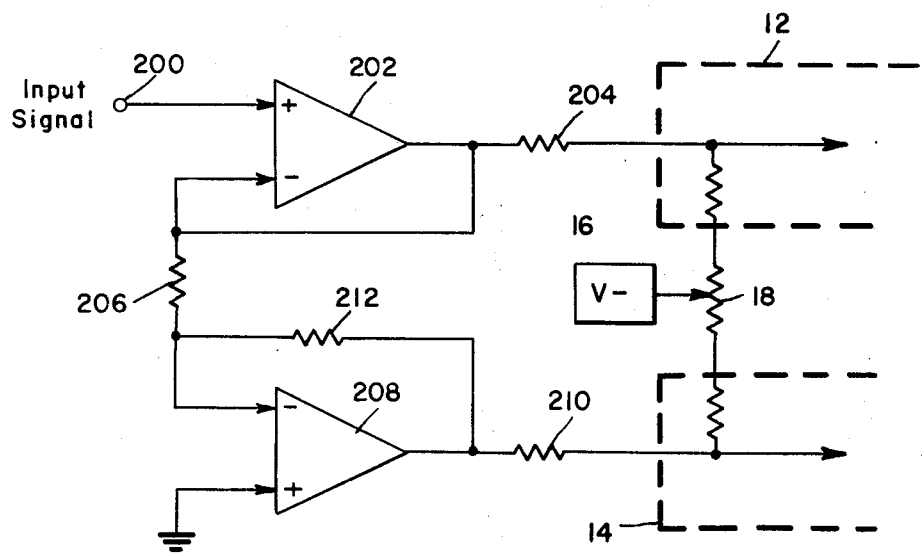
FIG. 3 is a schematic diagram of a first embodiment showing modification of the input signal.

Referring now to FIG. 3, there is shown a variation of the input signal being fed to summing converters 12 and 14. A single input signal is fed to terminal 200 which is also connected to the non-inverting side of a first operational amplifier 202. The output of amplifier 202 feeds the summing converter 12 through a resistor 204 and also feeds back a signal to the inverting input of amplifier 202.

The signal is also fed through resistor 206 to the inverting input of a second operational amplifier 208. The output of amplifier 208 is fed through resistor 210 to the input of summing converter 14. The output signal from amplifier 208 is fed back through resistor 212 to the inverting input of amplifier 208.

In this fashion a single ended input signal can be operated upon to obtain equal and reciprocal signals for feeding the summing converters 12 and 14.

Figure 4:
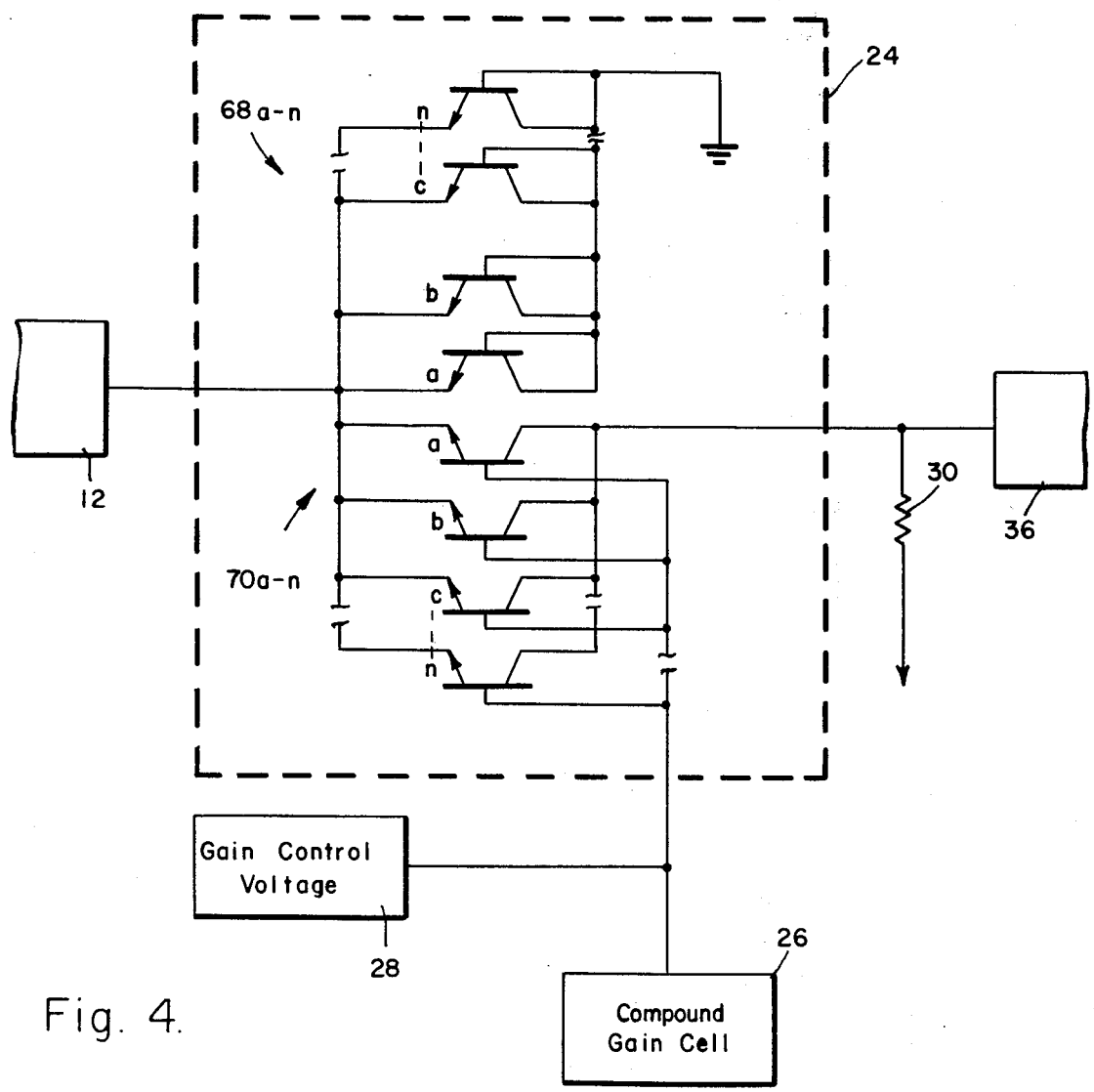
FIG. 4 is a circuit diagram illustrating parallel connected transistors forming a compound transistor for minimizing current densities.

Referring now to FIG. 4, there is shown compound gain cell 24 connected in circuit with multiple parallel transistors forming transistors 68 and 70.

Transistor 68 is actually composed of a plurality of separate transistors 68a, 68b, 68c through 68n, each connected in parallel with each other to form multiple parallel paths for each element. In this way the current density per unit area is decreased in accordance with the teachings of this invention.

In a similar way transistor 70 is composed of a plurality of transistors 70a, 70b, 70c through 70n, all connected in parallel and connected in circuit.

Experience has shown that utilizing compound transistors in the gain cell does result in more linear operation, lower distortion, lower noise, and therefore wider dynamic range.

By way of review it will be appreciated that this invention is based on the established principle of the current sharing properties of the differential amplifiers wherein the sum of the currents through the two collectors is a constant approximately equal to the current into the joined emitters and is shared in proportion to the relative bias on each transistor at its base.

In the input circuits, each current source transistor, unlike the prior art, is approached separately with reciprocal out of phase signals to be controlled. Also unlike prior art, the current source transistors can be viewed as linearized common base amplifiers with the input being the sum of the quiescent DC current and a signal which is not limited to AC but could also be DC since the input is directly coupled.

The common base amplifier features provide inherently faster operation that the common emitter amplifier since the internal capacitance of the common base amplifiers act in series rather than in parallel thus reducing the Miller effect which is the main obstacle to higher speed operation.

Superior distortion performance is claimed over an extended dynamic range because each of the common base amplifiers is independently linearized by surrounding circuitry as described. This linearization improves all performance parameters of the common base amplifiers.

Prior art attenuators have not been able to achieve the performance factors claimed for these circuits since it was always considered necessary to operate at very low currents on the order of 1 to 10 microamperes in order to minimize noise current and to operate the transistors in their most linear regions to minimize distortion. Unfortunately these prior art practices would force the designer to use large impedances around the attenuator circuits which have the effect of generating considerable thermal noise voltage which was always considered a limitation on this type of attenuator.

The use of compound transistors in the gain cell also greatly reduces the noise voltage characteristic of the transistor because effective transistor impedances and noise currents are reduced. The large area transistor is equivalent to a plurality of parallel small transistors.

The large area or compound transistors may be operated at sufficiently low current density to minimize distortion while maintaining low impedances around the devices to lower the noise products. In the multiple transistor, each single transistor is operated at low current and the currents are summed by paralleling the transistors while the like voltages in parallel remain the same.

The ability of the large area or compound transistor to handle large currents also reduces the required impedances and thus lowers the noise voltages caused by high impedance load resistors in the surrounding circuitry.

We claim:
1. A voltage controlled attenuator comprising:
   a pair of gain cells each being directly fed by an actively linearized current source adapted to receive an input signal,
   said gain cells being controlled by a single gain control voltage,
   a pair of linearized buffer amplifiers each having an actively linearized current source and connected to the output of each of said gain cells for linear operation over a wide range of DC quiescent input operating conditions and minimizing loading on said gain cells, and
   a differential output amplifier being fed by said buffer amplifiers for generating an output signal whereby the effect of control voltage in the output signal and any DC shift caused by changes in control voltage and remaining distortion products are removed.
2. A voltage controlled attenuator according to claim 1 in which said pair of gain cells each have a pair of transistors with base, emitter and collector,
   each pair of transistors having said emitters connected directly together and each pair of emitters fed by said separate linearized current source.
3. A voltage controlled attenuator according to claim 2 in which said voltage controlled attenuator includes multiple parallel transistors for maintaining low current densities.

4. A voltage controlled attenuator according to claim 2 in which said voltage controlled attenuator includes large geometry transistors for maintaining low current densities and low circuit impedances.

5. A voltage controlled attenuator comprising:
a pair of gain cells each being directly fed by a linearized current source adapted to receive an input signal,
said pair of gain cells each have a pair of transistors with base, emitter and collector, each pair of transistors having said emitters connected directly together and each pair of emitters fed by said separate linearized current source,
a pair of linearized buffer amplifiers each having a linearized current source and connected to the output of each of said gain cells for linear operation over a wide range of DC quiescent input operating conditions and minimizing loading on said gain cells,
one transistor of each pair has the base and collector directly connected together and directly to signal ground and in which a resistor is connected from the collectors of said other transistor in each pair to a voltage source thereby developing signal voltages across each transistor that are fed to the linearized buffer amplifiers for maintaining appropriate loading on the gain cells and minimizing the loading effect of the differential output amplifier, and
a differential output amplifier being fed by said buffer amplifiers for generating an output signal whereby the effect of control voltage in the output signal and any DC shift caused by changes in control voltage and remaining distortion products are removed.

6. A voltage controlled attenuator comprising:
a pair of gain cells having low current densities and low circuit impedances each being directly fed by a linearized current source adapted to receive an input signal,
said gain cells being controlled by a single gain control voltage,
a pair of linearized buffer amplifiers each connected to the output of one of said gain cells for minimizing loading on said gain cells,
said pair of linearized current sources are each common base amblifiers fed by an inverted and a non-inverted signal source respectively and having a second inverting amplifier in feedback between emitter and base, and
a differential output amplifier being fed by said buffer amplifiers for generating an output signal whereby the effect of control voltage in the output signal and any DC shift caused by changes in control voltage and remaining distortion products are removed.

7. A voltage controlled attenuator comprising:
a pair of gain cells having low current densities and low circuit impedances each being directly fed by a linearized current source adapted to receive an input signal,
said gain cells being controlled by a single gain control voltage,
a pair of linearized buffer amplifiers each connected to the output of one of said gain cells for minimizing loading on said gain cells,
said gain cells include multiple parallel transistors for maintaining low current densities and low circuit impedances, and
a differential output amplifier being fed by said buffer amplifiers for generating an output signal whereby the effect of control voltage in the output signal and any DC shift caused by changes in control voltage and remaining distortion products are removed.

8. A voltage controlled attenuator comprising:
a pair of gain cells each being directly fed by a linearized current source adapted to receive an input signal,
said gain cells include large geometry transistors for maintaining low circuit densities and low circuit impedances,
said gain cells being controlled by a single gain control voltage,
a pair of linearized buffer emplifiers each having a linearized current source and connected to the output of each of said gain cells for linear operation over a wide range of DC quiescent input operating conditions and minimizing loading on said gain cells, and
a differential output amplifier being fed by said buffer amplifiers for generating an output signal whereby the effect of control voltage in the output signal and any DC shift caused by changes in control voltage and remaining distortion products are removed.

9. A voltage controlled attenuator comprising,
a pair of gain cells each having a pair of transistors with base, emitter and collector,
each pair of transistors having said emitters connected directly together and each pair of emitters directly fed by a separate current source adapted to receive an input signal,
one transistor of each pair having the base and collector connected directly together and to signal ground,
the base of said other transistor of each pair being connected directly together and fed by a single gain control voltage,
a separate resistor connected from each of the collectors of said other transistors in each pair to a voltage source thereby developing output signal voltages across each resistor, and
a buffered differential amplifier connected across each resistor for generating an output signal whereby loading of the gain cells is minimized and the effect of control voltage and distortion in the output signal and any DC shift caused by changes in control voltage is removed.

10. A gain cell comprising two pairs of multiple parallel transistors for maintaining low current densities each transistor having a base, emitter and collector,
each pair of transistors having said emitters connected together and each pair of emitters adapted to be directly fed by a separate current source,
one transistor of each pair having the base and collector connected together to ground and to each other,
the base of said outer transistor of each pair being connected together and fed by a single gain control voltage,
a separate resistor connected from each of the collectors of said other transistors in each pair of a voltage source thereby developing output signals across each resistor, and a linearized buffer amplifier connected across each resistor for maintaining appropriate loading on the gain cells and extending the undistorted output range of the buffer amplifier.

11. A gain cell comprising, two pairs of large geometry transistors for maintaining low current densities and low current impedances each having a base, emitter and collector, each pair of transistors having said emitters connected together and each pair of emitters adapted to be directly fed by a separate current source, one transistor of each pair having the base and collector connected together to ground and to each other, the base of said other transistor of each pair being connected together and fed by a single gain control voltage, a separate resistor connected from each of the collectors of said other transistors in each pair to a voltage source thereby developing output signals across each resistor, and a linearized buffer amplifier connected across each resistor for maintaining appropriate loading on the gain cells and extending the undistorted output range of the buffer amplifier.

* * * * *